United States Patent [19]

Miyazawa et al.

[11] Patent Number: 4,736,123
[45] Date of Patent: Apr. 5, 1988

[54] MOS LOGIC INPUT CIRCUIT HAVING COMPENSATION FOR FLUCTUATIONS IN THE SUPPLY VOLTAGE

[75] Inventors: Yuichi Miyazawa, Tokyo; Kenji Sakaue, Yokohama, both of Japan

[73] Assignee: Kabushiki Kaisha Toshiba, Kawasaki, Japan

[21] Appl. No.: 30,384

[22] Filed: Mar. 26, 1987

[30] Foreign Application Priority Data

Mar. 31, 1986 [JP] Japan .................... 61-72999

[51] Int. Cl.$^4$ .................... H03K 19/003
[52] U.S. Cl. .................... 307/443; 307/200 B; 307/451; 307/579; 307/264
[58] Field of Search .................... 307/200 B, 443, 448, 307/451, 452–453, 491, 359, 360, 542, 552, 568, 572, 577, 579, 584, 585, 264, 297, 303

[56] References Cited

U.S. PATENT DOCUMENTS

| | | | |
|---|---|---|---|
| 3,578,600 | 3/1976 | Magee | 307/579 X |
| 4,122,360 | 10/1978 | Kawagai et al. | 307/452 |
| 4,209,713 | 6/1980 | Satou et al. | 307/443 X |
| 4,305,009 | 12/1981 | Miyagawa et al. | 307/585 X |
| 4,430,583 | 2/1984 | Shoji | 307/452 X |
| 4,437,025 | 3/1984 | Liu et al. | 307/584 X |
| 4,532,439 | 7/1985 | Koike | 307/451 X |
| 4,555,642 | 11/1985 | Morales | 307/585 X |
| 4,584,491 | 4/1986 | Ulmer | 307/443 X |
| 4,672,241 | 6/1987 | Veukatesh | 307/585 X |
| 4,694,199 | 9/1987 | Goetz | 307/491 X |

Primary Examiner—Stanley D. Miller
Assistant Examiner—D. R. Hudspeth
Attorney, Agent, or Firm—Finnegan, Henderson, Farabow, Garrett & Dunner

[57] ABSTRACT

A CMOS logic circuit includes a first MOS transistor of one conductivity type and second and third MOS transistors of a conductivity type opposite to that of the first MOS transistor, the first to third MOS transistors being conducted in series with each other between first and second power source terminals. The gate of the first MOS transistor and the gate of one of the second and third MOS transistors commonly receive a input signal. The gate of the other of the second and third MOS transistors, serving as a correcting transistor, is connected to the first power source terminal. A series connecting point of the first and second MOS transistors serves as an output node. A channel size ratio W/L (where W is the channel width and L is the channel length) or an absolute value of a gate threshold voltage of the first MOS transistor is different from that of the correcting transistor.

14 Claims, 7 Drawing Sheets

FIG. 3A  ø

FIG. 3B  $\overline{RST}$

FIG. 4A  ø

FIG. 4B  RST

MOS LOGIC INPUT CIRCUIT HAVING COMPENSATION FOR FLUCTUATIONS IN THE SUPPLY VOLTAGE

BACKGROUND OF THE INVENTION

The present invention relates to an improvement in a logic circuit such as an input gate of a CMOS LSI and, more particularly, to a logic circuit for stabilizing and, input logic threshold level, in the face of fluctuations in a power source voltage.

CMOS inverter 10 is a typical conventional CMOS LSI input gate, which consists of p- and n-channel CMOS transistors P1 and N1, as is shown in FIGS. 1 or 2. A gate input to inverter 10 is either a TTL level input signal (e.g., $\overline{RST}$) of active low or one (e.g., RST) of active high supplied from external signal input pad 11. If system clock $\phi$ (FIG. 3A) is supplied to a clock input terminal of an LSI having the input gate shown in FIG. 1, the low active period of the $\overline{RST}$ signal (FIG. 3B) is set to coincide with, for example, two cycles of clock $\phi$. Similarly, if system clock $\phi$ (FIG. 4A) is supplied to a clock input terminal (not shown) of an LSI having the input gate shown in FIG. 2, the high active period of the RST signal (FIG. 4B) is set to coincide with, for example, two cycles of clock $\phi$.

When, in the LST having the input gate of low active operation (as shown in FIG. 1), buffers having a large drive capacity (i.e., the ratio W/L of gate width W to gate length L is large) are driven simultaneously, circuit-ground potential VSS often varies from 0 V to 1 V (this phenomenon is called potential floating). In this case, the current drive capacity of transistor N1 is degraded, and switching threshold voltage VM of inverter 10 is shifted from a predetermined level to high level. When power source potential VDD is lowered from, for example, 5 V to 4 V, upon simultaneous operation of the buffers, voltage VM is shifted from the predetermined level to lower level.

Assume that threshold voltage VM is lowered during the low active period of the $\overline{RST}$ signal, upon lowering of the VDD potential. In this case, CMOS inverter 10 detects the $\overline{RST}$ signal as a high level signal, although the $\overline{RST}$ signal is actually set at low level. If the low active period of the $\overline{RST}$ signal is long enough (i.e., 2-cycle period of clock $\phi$) so that temporary noise superposed on the input to inverter 10 attenuates, an accurate logic level can eventually be detected. When voltage VM is elevated due to floating of the VSS potential during the low active period of the $\overline{RST}$ signal, inverter 10 can accurately detect the low level of the $\overline{RST}$ signal. However, if voltage VM is elevated due to floating of the VSS potential during the nonactive period of the $\overline{RST}$ signal, inverter 10 tends to erroneously detect the $\overline{RST}$ signal as a low level signal, although it is actually set at high level.

Similarly, if, in the LSI having the input gate of active high operation (as shown in FIG. 2), threshold voltage VM is lowered due to lowering of the VDD potential during the nonactive period of the RST signal, inverter 10 tends to erroneously detect the RST signal as a high level signal, although it is actually set at low level.

Fluctuations, such as floating of the VSS potential and lowering of the VDD potential, increase with any increase in the number of I/O pins of the LSI, that is, any increase in the number of I/O buffers.

SUMMARY OF THE INVENTION

The present invention has been conceived in order to solve the above problem arising from faulty operation of a logic circuit, due to changes in the switching threshold voltage, caused by fluctuations of the power source voltage, and has as its object to provide a MOS logic input circuit wherein logic threshold voltage variations caused by fluctuations of the power source voltage are small, and noise margins during operation of the circuit are large.

In a MOS logic circuit according to the present invention, a first MOS transistor of a first conductivity type, and second and third MOS transistors, both of a second conductivity type, the opposite of the first conductivity type, are connected in series with each other between first and second power source terminals. An input signal is commonly supplied to the gate of the first MOS transistor and to the gate of one of the second and third MOS transistors. The first power source terminal is connected to the gate of the other (i.e., correcting transistor) of the second and third transistors. A common junction between the first and second MOS transistors serves as an output node. The first MOS transistor and the correcting transistor are designed such that channel size ratio W/L (where W is the channel width and L is the channel length) and/or the absolute values of the gate threshold voltages of these transistors differ from each other.

Even if a gate-source voltage of the first MOS transistor is changed by a fluctuation of the power source voltage, thereby reducing the output node drive capacity of the first transistor, the gate input potential of the correcting transistor is also changed, so that the output node drive capacities of the second and third MOS transistors are reduced. In this case, the channel size ratios or the absolute values of the gate threshold voltages of the first and correcting transistors are set such that a difference between the reductions of the drive capacities of the two transistors, caused by the fluctuation of the power source voltage, is minimized. As a result, a variation in logic threshold voltage of the MOS logic input circuit is made small. Therefore, the increased noise margin ensures stable operation, in spite of fluctuation in the power source voltage.

BRIEF DESCRIPTION OF THE DRAWINGS

FIGS. 3A and 3B are timing charts for explaining the operation of the circuit shown in FIG. 1;

FIGS. 4A and 4B are timing charts for explaining the operation of the circuit shown in FIG. 2;

DETAILED DESCRIPTION OF THE PREFERRED EMBODIMENTS

An embodiment of the present invention will now be described, with reference to the accompanying drawings.

Figure 6:
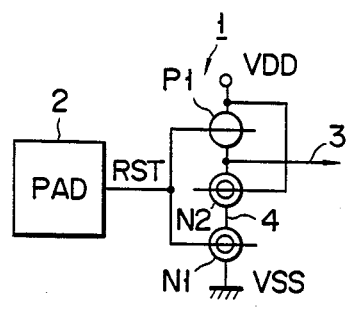
FIG. 6 shows an input gate circuit according to an embodiment of the present invention, in which a correcting side transistor (N2) is of an n-channel type, the drain of which is connected to an output node (3) and the source of which is connected to the drain of a negative power source side NMOS transistor (N1)

Referring to FIG. 6, reference numeral 1 denotes an input gate circuit of an LSI; and 2, a pad for externally receiving TTL level signal RST of active high. In gate circuit 1, PMOS transistor P1, NMOS transistor N2, and NMOS transistor N1 are connected in series with each other, between the VDD positive power source terminal (VDD source) and the VSS negative power source terminal (ground source). The gates of transistors P1 and N1 are connected to pad 2. The gate of transistor N2 is connected to the VDD source. The connecting point between the drains of transistors P1 and N2 serves as output mode 3.

Input gate circuit 1 receives the RST signal of active high. A decrease in threshold voltage VM, caused by a decrease in the VDD potential during the nonactive period of the RST signal, should be sufficiently small, as described above. NMOS transistor N2 is used as a correcting transistor for reducing the amount of the decrease in VM.

The operation of correcting threshold voltage VM upon lowering of the VDD potential in input gate circuit 1 will be described below. Assume that the VDD potential is decreased from 5 V to 4 V. Then, absolute value $|VGS|$ of the gate-source voltage of transistor P1 is lowered to degrade its load drive capacity. In this case, at the same time, gate input potential VDD of transistor N2 is also lowered to degrade the total drive capacity of transistors N1 and N2.

If the degradation of the load drive capacity of the PMOS transistor, with respect to deviation $\Delta$VDD in the VDD potential, is substantially the same as that of the NMOS transistor, deviation $\Delta$VM in switching threshold voltage VM is small. In order to achieve this, channel size ratio Wn/Ln (or its gate threshold level voltage VTHN) of NMOS transistor N2 is set to be different from channel size ratio Wp/Lp (or gate threshold level voltage VTHP) of PMOS transistor P1, where Wn and Wp are channel widths of transistors N2 and P1, and Ln and Lp are channel lengths of transistors N2 and P1, respectively.

Figure 16:
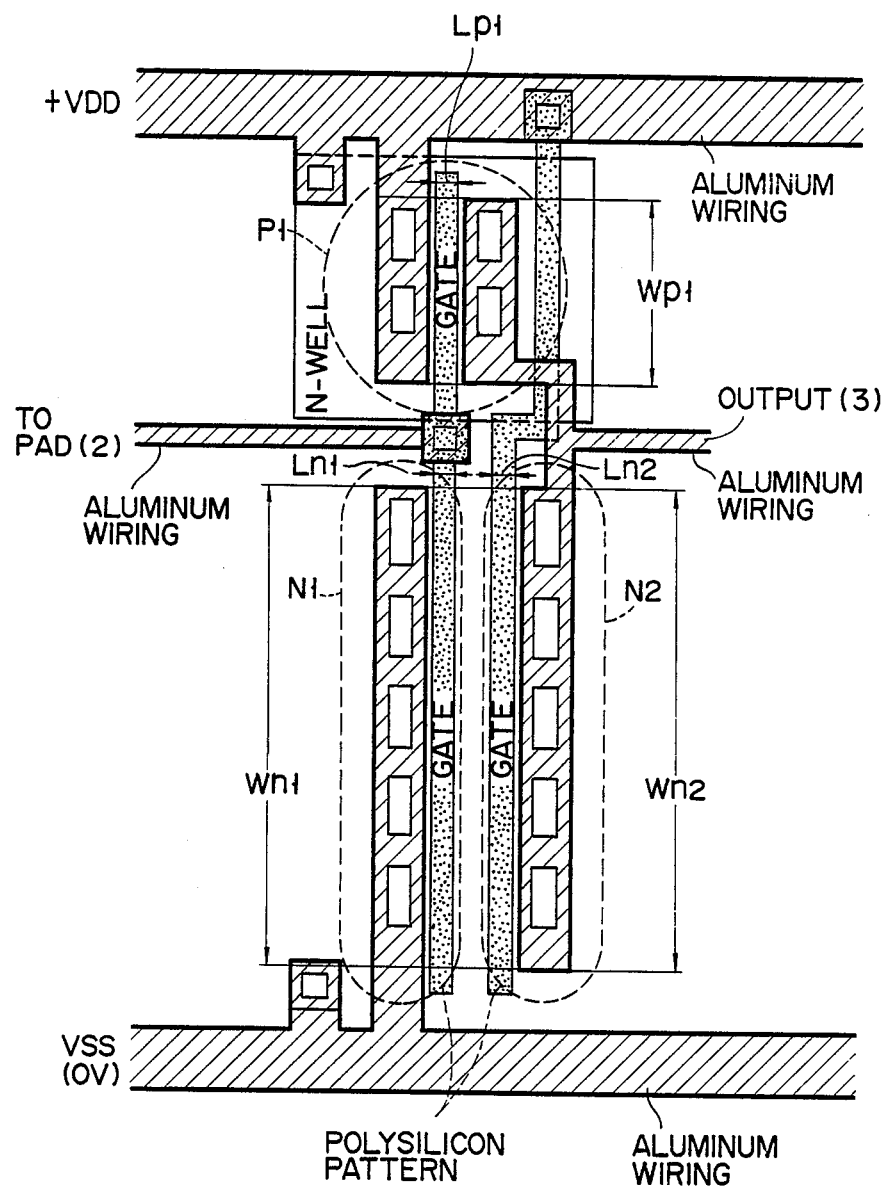
FIG. 16 is a plane view showing channel widths (Wp1, Wn1, Wn2) and channel lengths (Lp1, Ln1, Ln2) of MOS transistors (P1, N1, N2) of FIG. 6.

FIG. 16 shows an arrangement for reducing $\Delta$VM, wherein each of ratios Wn1/Ln1 and Wn2/Ln2 of NMOS transistors N1 and N2 is larger than ratio Wp1/Lp1 of PMOS transistor P1.

Assume that voltage VTHP of PMOS transistor P1 is −0.92 V, that voltages VTHN of NMOS transistors N1 and N2 are set to be 0.92 V each, that Wp/Lp of PMOS transistor P1 is 5/1.5, that Wn/Ln of NMOS transistor N1 is 20/1.2, and that Wn/Ln of NMOS transistor N2 is 15/1.2, which is larger than Wp/Lp of PMOS transistor P1. Under these assumptions, when the VDD potential is varied, deviation $\Delta$VM is calculated by known computer simulation program "SPICE2". "SPICE2" is described in detail in "SPICE2: A Computer Program to Simulate Semiconductor Circuits", L. W. Nagel, Memo ERL-M520, University of California, Berkeley, Calif., May 9, 1975.

Figure 7B:
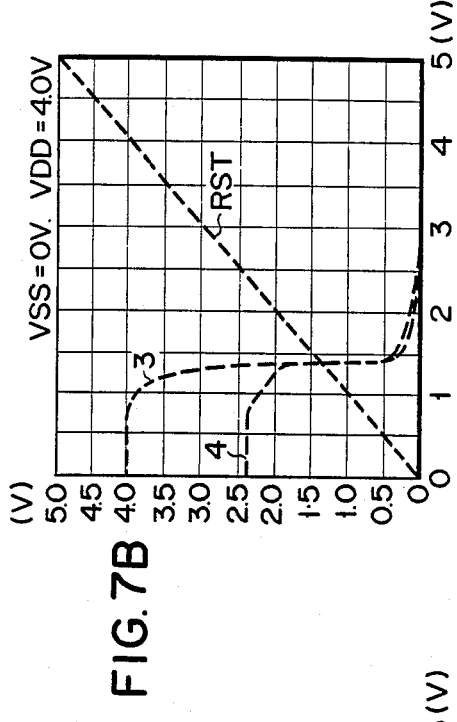
FIGS. 7A to 7D are graphs respectively showing simulation results of VDD potential dependency of a switching threshold voltage of the input gate circuit shown in FIG. 6.
Figure 7D:
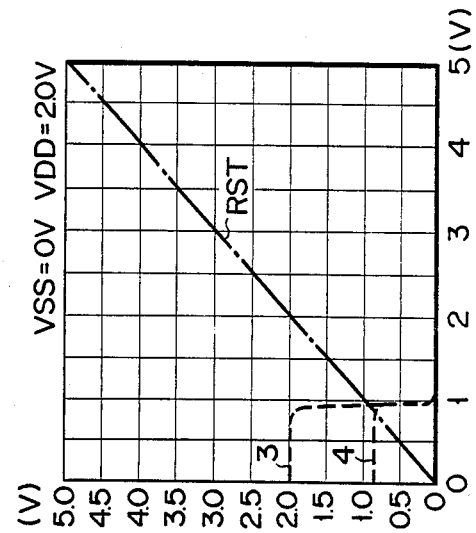
Figure 7A:
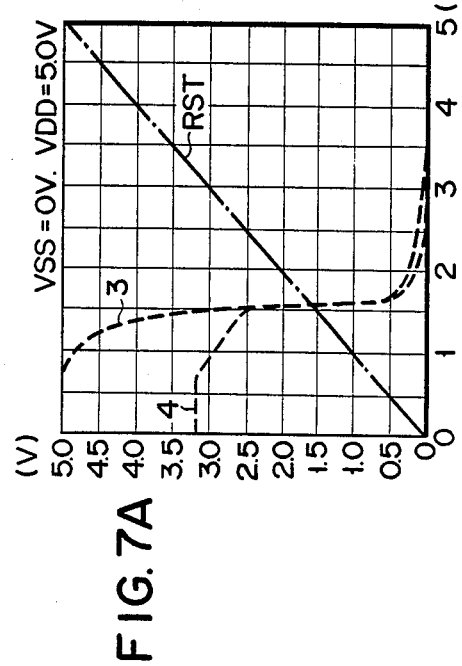
Figure 7C:
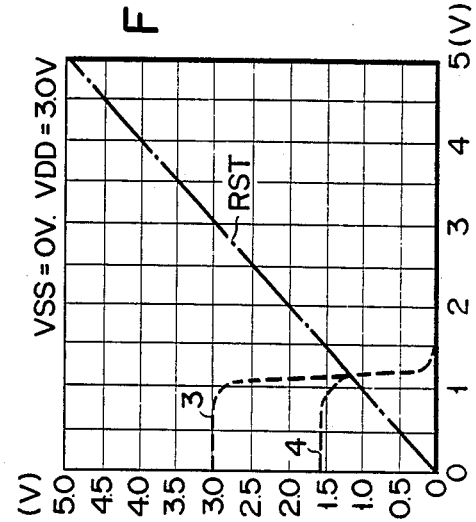

FIG. 7A shows level variations in output node 3 and node 4 (which is the connecting point between series-connected NMOS transistors N1 and N2), which occurs when an RST input is varied from 0 V to 5.0 V at VSS=0 V and VDD=5.0 V. If an input level for equalizing the input and output levels of the input gate circuit is defined as switching threshold voltage VM, VM (VDD=5 V)=1.54 V is established in the case of FIG. 7A. Level variations in nodes 3 and 4 are shown in FIGS. 7B, 7C, and 7D when the VDD potentials are set to be 4.0 V, 3.0 V, and 2.0 V, respectively, and VSS=0 V is preset. In these cases, VM(4 V)=1.33 V, VM(3 V)=1.16 V, and VM(2 V)=0.91 V. Maximum deviation $\Delta$VM in the range between 5.0 V and 2.0 V of the VDD potential is given as 0.63 V.

Figure 1:
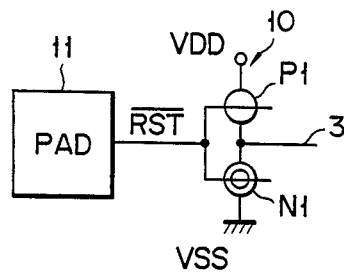
FIG. 1 is a circuit diagram showing a conventional LSI input gate circuit.
Figure 2:
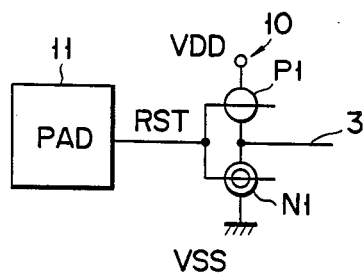
FIG. 2 is a circuit diagram showing another conventional LSI input gate circuit.
Figure 5A:
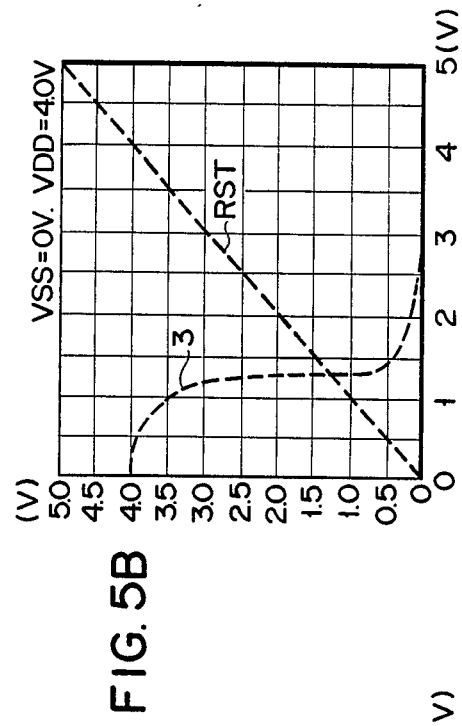
FIGS. 5A to 5D are graphs respectively showing simulation results for VDD potential dependency of a switching threshold voltage of the input gate circuit shown in FIG. 2.
Figure 5B:
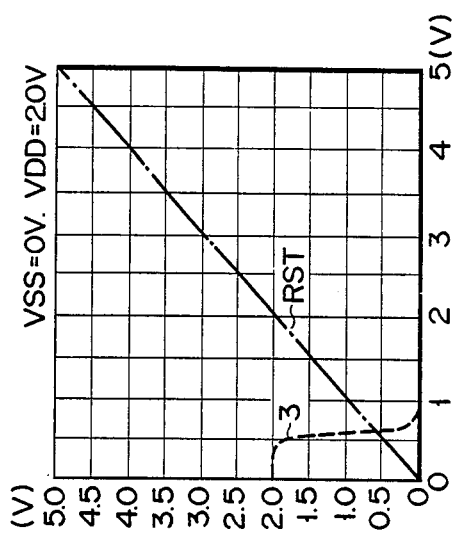
Figure 5C:
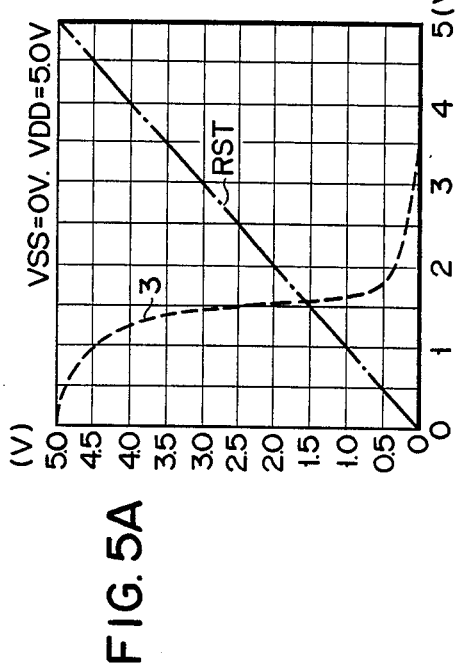
Figure 5D:
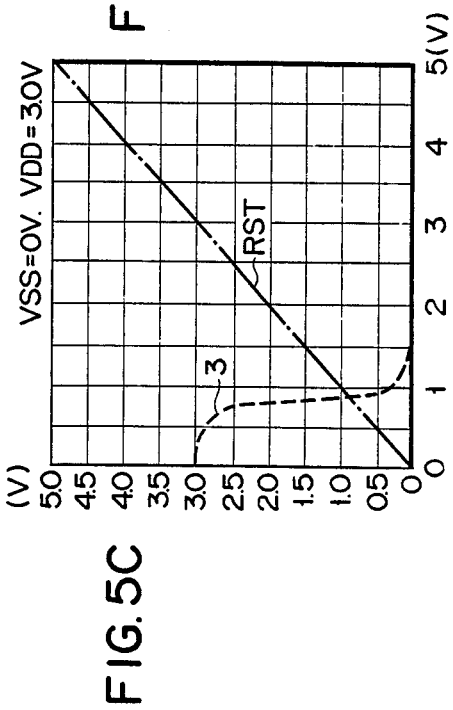

As a comparison, deviations $\Delta$VM, upon deviations $\Delta$VDD of the VDD potential in the conventional input gate circuit shown in FIG. 2, are calculated by the "SPICE2" simulation. If, in the input gate circuit of FIG. 2, VTHP of NMOS transistor P1 is −0.92 VTHN of NMOS transistor N1 is 0.92, Wp/Lp of PMOS transistor P1 is 6.5/1.5, and Wn/Ln of NMOS transistor N1 is 10/1.2, a level variation in output node 3 at VSS=0 V and VDD=5.0 V occurs, as is shown in FIG. 5A, so that VM (VDD=5 V)=1.54 V. Level variations in node 3 are shown in FIGS. 5B, 5C, and 5D when the VDD potentials are set to be 4.0 V, 3.0 V, and 2.0 V, respectively, and VSS=0 V is preset. In these cases, VM(4 V)=1.25 V, VM(3 V)=0.97 V, and VM(2 V)=0.59 V. Maximum deviation $\Delta$VM in the VDD potential range between 5.0 V and 2.0 V is as high as 0.95 V (compare $\Delta$VM=0.63 V obtained by the embodiment described above).

Figure 8:
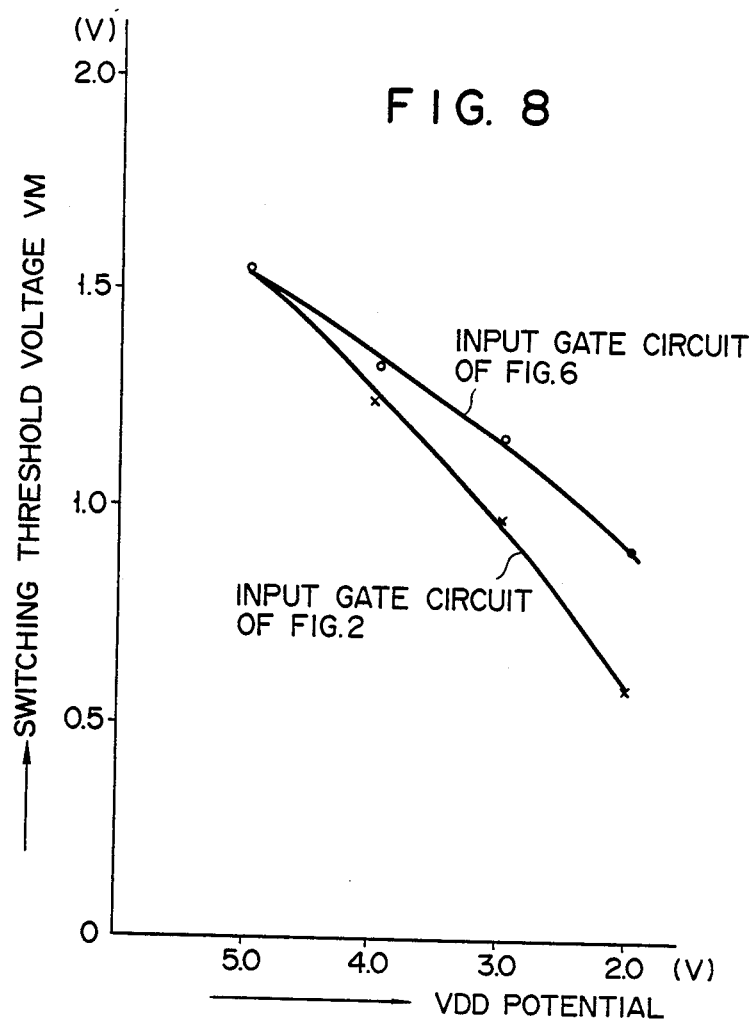
FIG. 8 is a graph showing a switching threshold voltage characteristic of the input gate of FIG. 6, obtained at room temperature, for comparing this characteristic with that of the input gate circuit shown in FIGS. 1 or 2.

The above results are summarized as follows:

VDD dependency of VM in the conventional input gate circuit (FIG. 2) and that in the input gate circuit (FIG. 6) according to the embodiment of the present invention are shown in FIG. 8. More specifically, deviation $\Delta$VM with respect to $\Delta$VDD in the embodiment of FIG. 6 is smaller than that in the conventional circuit of FIG. 2. It is therefore apparent that the gate input circuit according to this embodiment is stabler than that of the conventional circuit, with respect to fluctuations in the VDD potential. Even if fluctuations in the VDD power source voltage increase upon an increase in the number of input/output buffers of the LSI, stable operation of the input gate circuit of this embodiment (FIG. 6) can be assured. In addition, the circuit of this embodiment can be realized simply by inserting the correcting transistor (N2) in the CMOS inverter (P1, N1).

In order to differentiate the gate threshold level voltage of correcting NMOS transistor N2 from that of PMOS transistor P1, absolute value |VTHN| of the gate threshold level voltage of transistor N2 is set to be larger than absolute value |VTHP| of the gate threshold level voltage of transistor P1, to thereby obtain the same effect (i.e., a decrease in $\Delta$VM) as in the embodiment of FIG. 6. In order to establish condition |VTHN|>|VTHP|, for example, p-type impurities whose dose is larger than that of n-type impurities below the gate oxide film of PMOS transistor P1 are ion-implanted under the gate oxide film of NMOS transistor N2. The gate threshold voltage levels of MOS transistors P1, N1, and N2 can be arbitrarily changed according to the doses of impurities under the corresponding gate oxide films. Note here that the larger the amount of the dose, the higher the gate threshold voltage in the positive direction for NMOS, and in the negative direction for PMOS.

Figure 17:
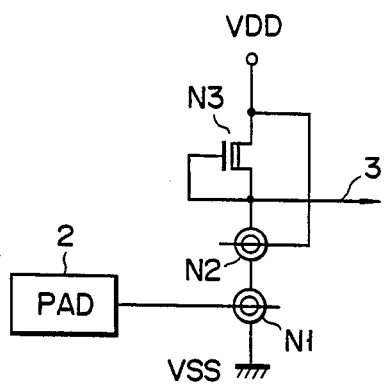
FIG. 17 shows yet another modification of the circuit of FIG. 6, in which the PMOS transistor (P1) of FIG. 6 is replaced by an n-channel depletion MOS transistor (N3) serving as a load.
Figure 18:
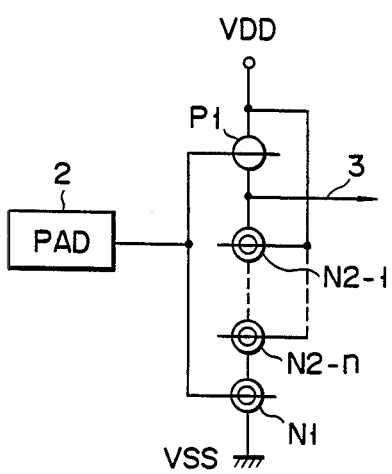
FIG. 18 shows a modification of the circuit shown in FIG. 11, in which n (n≧2) correcting NMOS transistors (N2-1–N2-n) are inserted between an output node (3) and a negative power source side MOS transistor (N1).

The present invention is not limited to the particular embodiments described above, but can be applied to the input gate circuits shown in FIGS. 9 to 13 or in FIGS. 17 and 18. The present invention can also be applied to an RS flip-flop as shown in FIG. 14.

Figure 9:
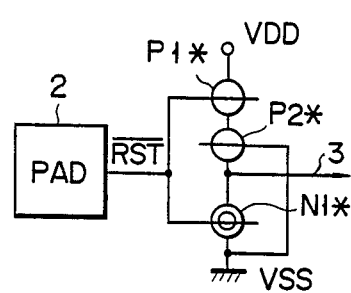
FIG. 9 shows a modification of the circuit shown in FIG. 6, in which a correcting MOS transistor (P1>) is of a p-channel type, the drain of which is connected to an output node (3)

In an input gate circuit shown in FIG. 9, NMOS transistor N2 of FIG. 6 is replaced by PMOS transistor P1*, and the electrical connections of the two power sources are reversed. Reference numerals P1* and P2* in FIG. 9 denote PMOS transistors; and N1*, an NMOS transistor. Channel size ratio Wp/Lp of correcting PMOS transistor P2* is larger than channel size ratio Wn/Ln of NMOS transistor N1*. Deviation $\Delta$VM can be reduced in the input gate circuit of FIG. 9, in the same manner as in FIG. 6. When the $\overline{\text{RST}}$ signal of active low is input to the input gate circuit, an increase in threshold voltage VM, caused by floating of the VSS potential in the nonactive period, can be suppressed.

Figure 10:
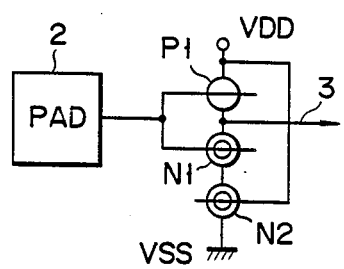
FIG. 10 shows another modification of the circuit shown in FIG. 6, in which the source of a correcting NMOS transistor (N2) is grounded.

In the input gate circuit of FIG. 10, the positions of correcting NMOS transistor N2 and gate input NMOS transistor N1 are reversed, when compared with the arrangement of the input gate circuit of FIG. 6.

Figure 11:
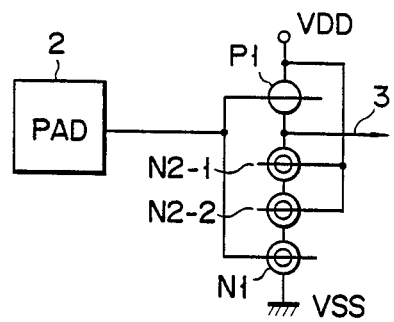
FIG. 11 shows a further modification of the circuit shown in FIG. 6, in which two series-connected correcting NMOS transistors (N2-1, N2-2) are inserted between an output node (3) and a negative power source side MOS transistor (N1)
Figure 12:
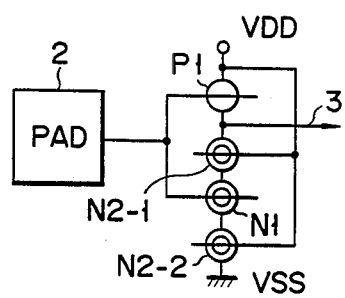
FIG. 12 shows yet another modification of the circuit shown in FIG. 6, in which correcting NMOS transistors (N2-1, N2-2) are respectively inserted between an output node (3) and a negative power source side MOS transistor (N1) and between the negative power source side MOS transistor (N1) and a negative power source (VSS)

In the input gate circuits shown in FIGS. 11 and 12, the number of correcting NMOS transistors (N2-1, N2-2) is increased to two, and these are connected in series with each other. The only difference between the circuits of FIGS. 11 and 12 is the circuit location of one (N2-2) of the correcting NMOS transistors (N2-1, N2-2).

More specifically, in FIG. 11, the drain of one (N2-1) of series-connected correcting NMOS transistors N2-1 and N2-2 is connected to output node 3, and the source of the other (N2-2) is connected to the drain of negative power source (ground source) side NMOS transistor N1. However, in FIG. 12, the drain-source path of negative power source side NMOS transistor N1 is situated between the source of one (N2-1) of correcting NMOS transistors N2-1 and N2-2 and the drain of the other (N2-2).

Figure 13:
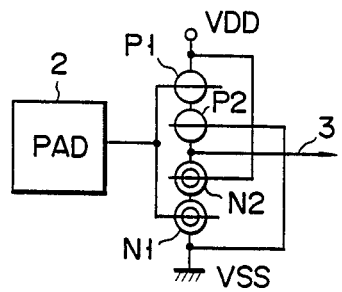
FIG. 13 shows still another modification of the circuit shown in FIG. 6, in which a correcting MOS transistor (P2) is inserted between a positive power source side MOS transistor (P1) and an output node (3), and a correcting NMOS transistor (N2) is inserted between a negative power source side MOS transistor (N1) and the output node (3)
Figure 14:
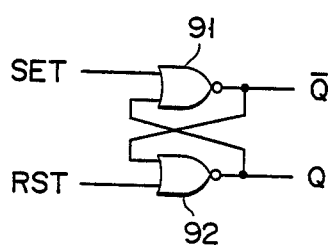
FIG. 14 shows an RS flip-flop as an application example of the present invention.

In an input gate circuit shown in FIG. 13, additional correcting PMOS transistor P2 is inserted in the p-channel side of the input gate circuit of FIG. 6. The circuit shown in FIG. 13 corresponds to a combination of the circuits of FIGS. 6 and 9. According to the circuit of FIG. 13, stable threshold voltage VM can be obtained in spite of fluctuations in the VSS power source and the VDD power source.

Figure 15:
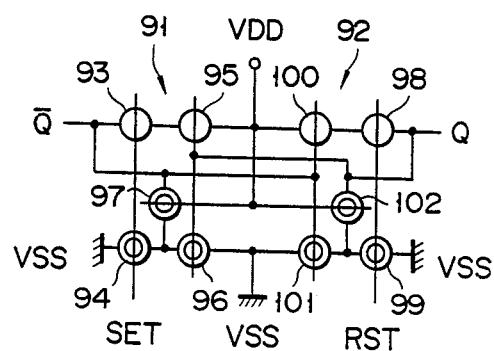
FIG. 15 shows a circuit arrangement when the flip-flop of FIG. 14 is constituted by logic circuits according to the present invention.

FIG. 14 shows an RS flip-flop as an application example of the present invention, and FIG. 15 shows a circuit arrangement of the flip-flop of FIG. 14 when it is constituted by logic circuits according to the present invention.

As is shown in FIG. 14, the RS flip-flop comprises two 2-input NOR gates, 91 and 92, arranged such that the output terminals are cross-coupled to the corresponding input terminals. In NOR gate 91 of FIG. 15, reference numerals 93 and 94 denote set (SET) input PMOS and NMOS transistors, respectively. Reference numerals 95 and 96 respectively denote PMOS and NMOS transistors for receiving the Q output of the flip-flop. Reference numeral 97 denotes a correcting NMOS transistor.

In the other NOR gate 92, reference numerals 98 and 99 denote reset (RST) input PMOS and NMOS transistors, respectively. Reference numerals 100 and 101 respectively denote PMOS and NMOS transistors for receiving the $\overline{\text{Q}}$ output of the flip-flop. Reference numeral 102 denotes a correcting NMOS transistor. In an RS flip-flop having such correcting transistors, operation errors hardly occur in response to the SET and RST inputs of MOS level obtained from a prestage circuit (not shown), even if fluctuations occur in the power source voltage.

FIG. 17 shows a case wherein the present invention is applied to an NMOS device. PMOS transistor P1 of FIG. 6 is replaced by depletion NMOS transistor N3 serving as a load.

FIG. 18 shows a case wherein the number of series-connected NMOS transistors N2-1 and N2-2 in FIG. 11 is increased to n (n$\geq$2).

According to the MOS logic circuit described above, the correcting transistor is arranged to reduce a change in the switching threshold voltage, on the basis of fluctuations in the power source voltage, with the result that noise margins during circuit operation can be increased even if the circuit is subjected to fluctuations in the power source voltage. Therefore, even if fluctuations in the power source voltage are increased upon increase in the number of input/output pins of an LSI, stable operation can be ensured by use of the circuit of the present invention.

What is claimed is:

1. A MOS logic circuit comprising a series circuit including at least first, second, and third MOS transistors connected between first and second power source terminals, wherein said second and third MOS transistors have the same conductivity type, which is different from that of said first MOS transistor, a gate of said first MOS transistor and a gate of at least one of said second and third MOS transistors receive an input signal, a gate of the other of said second and third MOS transistors, serving as a correcting MOS transistor, is connected to said first power source terminal, a series connecting point of said first and second MOS transistors serves as an output node of said logic circuit, and a channel size ratio of said first MOS transistor is significantly different from that of said correcting MOS transistor.

2. A circuit according to claim 1, wherein the channel size ratio of said correcting MOS transistor is greater than that of said first MOS transistor.

3. A circuit according to claim 1, wherein said logic circuit serves as a CMOS LSI input gate circuit.

4. A circuit according to claim 1, wherein said logic circuit serves as an internal circuit in a CMOS LSI.

5. A MOS logic circuit comprising a series circuit including at least first, second, and third MOS transistors connected between first and second power source terminals, wherein said second and third MOS transistors have the same conductivity type, which is different from that of said first MOS transistor, a gate of said first MOS transistor and a gate of at least one of said second and third MOS transistors receive an input signal, a gate of the other of said second and third MOS transistors, serving as a correcting MOS transistor, is connected to said first power source terminal, a series connecting point of said first and second MOS transistors serves as an output node of said logic circuit, and an absolute value of a gate threshold level voltage of said first MOS transistor is significantly different from that of said correcting MOS transistor.

6. A circuit according to claim 5, wherein the absolute value of the gate threshold level voltage of said correcting MOS transistor is greater than that of said first MOS transistor.

7. A circuit according to claim 5, wherein said logic circuit serves as a CMOS LSI input gate circuit.

8. A circuit according to claim 5, wherein said logic circuit serves as an internal circuit in a CMOS LSI.

9. A MOS logic circuit comprising a series circuit including at least first, second, and third MOS transistors connected between first and second power source terminals, wherein said second and third MOS transistors have the same conductivity type, which is different from that of said first MOS transistor, a gate of said first MOS transistor and a gate of at least one of said second and third MOS transistors receive an input signal, a gate of the other of said second and third MOS transistors, serving as a correcting MOS transistor, is connected to said first power source terminal, a series connecting point of said first and second MOS transistors serves as an output node of said logic circuit, and a channel size ratio and an absolute value of a gate threshold voltage of said first MOS transistor are significantly different from those of said correcting MOS transistor.

10. A circuit according to claim 9, wherein the channel size ratio of said correcting MOS transistor is greater than that of said first MOS transistor.

11. A circuit according to claim 9, wherein the absolute value of the gate threshold voltage of said correcting MOS transistor is greater than that of said first MOS transistor.

12. A circuit according to claim 10, wherein the absolute value of the gate threshold voltage of said correcting MOS transistor is greater than that of said first MOS transistor.

13. A circuit according to claim 9, wherein said logic circuit serves as a CMOS LSI input gate circuit.

14. A circuit according to claim 9, wherein said logic circuit serves as an internal circuit in a CMOS LSI.

* * * * *